US012754265B2

(12) United States Patent
Shrestha

(10) Patent No.: US 12,754,265 B2
(45) Date of Patent: Oct. 6, 2026

(54) RADIO FREQUENCY RECEIVER ARRAY FOR MAGNETIC RESONANCE IMAGING

(71) Applicant: KONINKLIJKE PHILIPS N.V., Eindhoven (NL)

(72) Inventor: Rameswor Shrestha, Veldhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 329 days.

(21) Appl. No.: 18/575,344

(22) PCT Filed: Jun. 28, 2022

(86) PCT No.: PCT/EP2022/067643
§ 371 (c)(1), (2) Date: Dec. 29, 2023

(87) PCT Pub. No.: WO2023/280628
PCT Pub. Date: Jan. 12, 2023

(65) Prior Publication Data

US 2024/0151791 A1 May 9, 2024

(30) Foreign Application Priority Data

Jul. 5, 2021 (EP) ..................................... 21183603

(51) Int. Cl.
*G01R 33/36* (2006.01)

(52) U.S. Cl.
CPC ..... *G01R 33/3621* (2013.01); *G01R 33/3692* (2013.01)

(58) Field of Classification Search
CPC ........................ G01R 33/3621; G01R 33/3692
See application file for complete search history.

(56) References Cited

U.S. PATENT DOCUMENTS 6,977,502 B1 12/2005 Hertz
8,896,377 B1 11/2014 Shrestha
(Continued)

FOREIGN PATENT DOCUMENTS

EP 1869485 A1 12/2007
EP 1938119 A2 7/2008
(Continued)

OTHER PUBLICATIONS

International Search Report and Written Opinion from PCT/EP2022/067643 mailed Aug. 10, 2022.

*Primary Examiner* — Gregory H Curran

(57) ABSTRACT

A radio frequency (RF) receiver array for magnetic resonance imaging, the RF receiver array (1) comprising at least one receiver coil element (2) for receiving a magnetic resonance signal from at least a portion of a target region, at least one on-board digital receiver circuit (3) for processing the received magnetic resonance signal. For on-coil digitization of the magnetic resonance signal the on-board digital receiver circuit (3) comprises an application-specific integrated circuit (4), ASIC. The RF receiver array (1) further comprises a plurality of signal lines (5) configured and arranged to carry data between the on-board digital receiver circuit (3) and a receiving unit (3, 7). For providing a capacitive communication between the on-board digital receiver circuit (3) and the receiving unit (3, 7) the ASIC (4) comprises at least one on-chip capacitor (6) for each signal line (5), wherein the on-chip capacitor (6) is disposed in series with the signal line (5).

20 Claims, 3 Drawing Sheets

(56) References Cited

U.S. PATENT DOCUMENTS

| | | | | |
|---|---|---|---|---|
| 10,317,291 | B2 * | 6/2019 | Fury | G01K 1/18 |
| 10,429,460 | B2 * | 10/2019 | Ouzounov | G01R 33/54 |
| 10,511,261 | B2 * | 12/2019 | Twieg | G01R 33/3621 |
| 2009/0137898 | A1 | 5/2009 | Demharter et al. | |
| 2015/0293192 | A1 | 10/2015 | Schmidt et al. | |
| 2018/0081007 | A1 | 3/2018 | Stormont et al. | |
| 2018/0348315 | A1 | 12/2018 | Fackelmeier | |
| 2020/0241091 | A1 | 7/2020 | Ji | |

FOREIGN PATENT DOCUMENTS

| | | | |
|---|---|---|---|
| WO | 2006030332 | A2 | 3/2006 |
| WO | 2006103635 | A1 | 10/2006 |
| WO | 2007043009 | A2 | 4/2007 |

* cited by examiner

RADIO FREQUENCY RECEIVER ARRAY FOR MAGNETIC RESONANCE IMAGING

CROSS REFERENCE TO RELATED APPLICATIONS

This application is a U.S. national phase application of International Application No. PCT/EP2022/067643 filed on Jun. 28, 2022, which claims the benefit of EP Application Ser. No. 21/183,603.6 filed on Jul. 5, 2021 and is incorporated herein by reference.

FIELD OF THE INVENTION

The invention relates to the field of radio frequency (RF) receiver arrays, and in particular to RF receiver arrays for magnetic resonance imaging. The invention further relates to a magnetic resonance imaging system comprising a RF receiver array for magnetic resonance imaging to a method for operating a RF receiver array and a computer program product.

BACKGROUND OF THE INVENTION

Traditionally coaxial cables are used to transport MR signals from the receiver coils to the nearby analog-to-digital (ADC) converters. However, this requires a bulky and heavy cable RF traps to block the common mode RF currents for safety reason. With an increased number of coils in an array, these bulky traps are rapidly becoming a bottleneck.

To overcome these issues, two attractive techniques: optical communication over optic fiber and wireless RF communication are proposed in numerous literatures. However, optical communication consumes significant power in the order of 100s of milli-watt, suffers from the loss of signal-to-noise ratio in the case of multimode transmission, and are bulky in size. On the other hand, wireless RF communication has significant challenges to recover the clock with sufficient clock quality resulting in a significant penalty in the overall noise figure and dynamic range. Furthermore, wireless communication is notorious for its unreliability in normal use and hence there is significant doubt of its capability to provide reliable communication in the harsh MR environment.

In the document WO2007043009A2 a radio frequency antenna is disclosed comprising a resonant pickup circuit arranged to pick up a magnetic resonance signal, an analog-to-digital converter arranged to convert the magnetic resonance signal to digital data, and a frequency converter arranged to convert a primary band of frequencies of the digital data. By upshifting the frequency of the transmitted bit-stream, it is possible to RF-trap the transmission channel by simple high-pass filtering techniques. In case the transmitted bit pattern has frequency components that approach the resonance frequency, an encoding technique like Manchester encoding can be used to eliminate unwanted signals. The US patent application US2018/0348315 discloses a receiving antenna that receiver a signal at the MR frequency. A signal converter is provided to digitize the received signal and upconvert it to a higher frequency band.

SUMMARY OF THE INVENTION

It is an object of the invention to provide a capacitive communication solution in an on-coil digitized radio frequency (RF) receiver array for magnetic resonance imaging that requires no RF traps, consumes low power and provides a high-speed communication.

According to the invention, this object is addressed by the subject matter of the independent claims. Preferred embodiments of the invention are described in the sub claims.

Therefore, according to the invention, a radio frequency (RF) receiver array for magnetic resonance imaging is provided, the RF receiver array comprising: at least one receiver coil element for receiving a magnetic resonance signal from at least a portion of a target region, at least one on-board digital receiver circuit for processing the received magnetic resonance signal, the on-board digital receiver circuit comprising an application-specific integrated circuit, ASIC for on-coil digitization of the magnetic resonance signal, the RF receiver array comprising a plurality of signal lines configured and arranged to carry data between the on-board digital receiver circuit and a receiving unit, the ASIC comprising at least one on-chip capacitor for each signal line, for providing a capacitive communication between the on-board digital receiver circuit and the receiving unit, wherein the on-chip capacitor is disposed in series with the signal line.

The main idea of the invention is to provide a capacitive communication solution for high speed and low power communication in MR receiver systems. Main advantage is that this solution eliminates the requirement for bulky and heavy RF cable traps as the RF currents at MR frequency is blocked by the capactor whereas the data edges pass through. The data communication speed (~1 Gbps) is much higher than the MR frequency. It is further advantageous that energy can be transferred along the data lines as a result of the galvanic connection.

The radio frequency (RF) receiver array of the invention is configured to receive magnetic resonance signals. To that end the receiver coil elements pick-up flux of the magnetic field of these magnetic resonance signals. On-board the RF receiver array one or several digital receiver circuits are provided that are coupled by signal lines. There may be fewer digital receiver units than RF receiver coil elements, and neighbouring receiver coil elements may share a single digital receiver circuit. These digital receiver circuits digitize the analogue signal at the output ports of the various receiver coil elements. Further a receiving unit is provided to function as an interface between the digital receiver circuits and the RF receiver array's output to the magnetic resonance examination system (e.g. the system host). The digitization of the magnetic resonance signal is done by way of ASICs provided in each the digital receiver units. The digital data are communicated between the various digital receiver units of the signal lines to the (interface) receiving unit and ultimately to the system host. The digital receiver units are linked to the receiver units by way of capacitive communication formed by on-chip capacitors in the respective ASICs in series with the respective signal lines. In fact the capacitors in the ASICS from local filters that block the MR frequency carrier frequency common mode. This only the differential signal is transmitted an bulky signal traps are not required on board the RF receiver array.

In an embodiment of the invention the receiving unit is a data interface of a magnetic resonance imaging system and/or a second on-board digital receiver circuit.

According to another embodiment of the invention each application-specific integrated circuit, ASIC of the on-board digital receiver circuit comprises a communication module for data communication over the signal lines, wherein each communication module comprises a transmitter and/or a receiver and each of the communication modules further comprising the on-chip capacitor disposed in series with the signal line.

In an embodiment of the invention, the receiver of the communication module comprises a common mode suppression circuit.

In another embodiment of the invention the signal lines are wires and/or a twisted differential pair cables and/or monolithic conductive lines. The signal lines can be implemented in a variety of ways.

According to an embodiment of the invention the on-chip capacitors are on-chip high voltage, low capacitance capacitors.

In a preferred embodiment of the invention, wherein the capacitance of the on-chip capacitors is about between 50 Femtofarad and 100 Femtofarad. The small value (50 fF-100 fF) and high voltage on-chip capacitors, provide a high impedance at MR frequencies. The use of small value capacitors makes sure to provide a high impedance path (>10 kOhm) at MR frequencies, blocking the current flow and eliminating a cable trapping requirement.

Beneficial the on-chip capacitor is integrated into the application-specific integrated circuit of the on-board digital receiver circuit.

In an embodiment of the invention the on-chip capacitor is formed by a bottom electrode, wherein the bottom electrode is a portion of a first metal layer of the application-specific integrated circuit, ASIC of the on-board digital receiver circuit, by an insulating layer formed on the bottom electrode and by a top electrode formed on the insulating layer, wherein the top electrode is a portion of a second metal layer of the application-specific integrated circuit, ASIC of the on-board digital receiver circuit. This provides a galvanically isolated and monolithically integrated capacitive communication solution between the MR receivers of an on-coil digitized coil array in an MR system.

In a further embodiment of the invention the RF receiver array comprises a plurality of on-board digital receiver circuits, wherein the on-board digital receiver circuits are connected in series with each other by the signal lines. With advancement of on-coil digitization of the MR signal with the application-specific circuit (ASIC) design, the receivers in the coil array can also be connected in series as well as in traditional structure where the data from each MR receiver is sent to a data interface of a magnetic resonance imaging system for further processing and image reconstruction.

In another aspect of the invention, the object is achieved by a magnetic resonance imaging system comprising a radio frequency (RF) receiver array for magnetic resonance imaging as described above.

In a further aspect of the invention, the object is achieved by a method for operating a radio frequency (RF) receiver array the method comprising the following steps:

- providing a radio frequency (RF) receiver array as described above,
- receiving a magnetic resonance signal from at least a portion of a target region using at least one receiver coil element of the RF receiver array,
- converting the magnetic resonance signal to a digital signal by an application-specific integrated circuit, ASIC of an on-board digital receiver circuit of the RF receiver array,
- sending the digital data over at least one signal line to a receiving unit.

In an embodiment of the invention the step of sending the digital data over at least one signal line to a receiving unit comprises the step of:

- providing a communication module in the application-specific integrated circuit, ASIC of the on-board digital receiver circuit, the communication module comprising a transmitter and a receiver for data communication over the signal lines,
- sending the digital data over the signal lines to a receiving unit by the transmitter,
- receiving the digital data by the receiver of the communication module in the application-specific integrated circuit, ASIC.

In a still further aspect of the invention, the object is achieved by a computer program product comprising machine executable instructions, wherein the machine executable instructions are for execution by a processor controlling a radio frequency (RF) receiver array as described above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
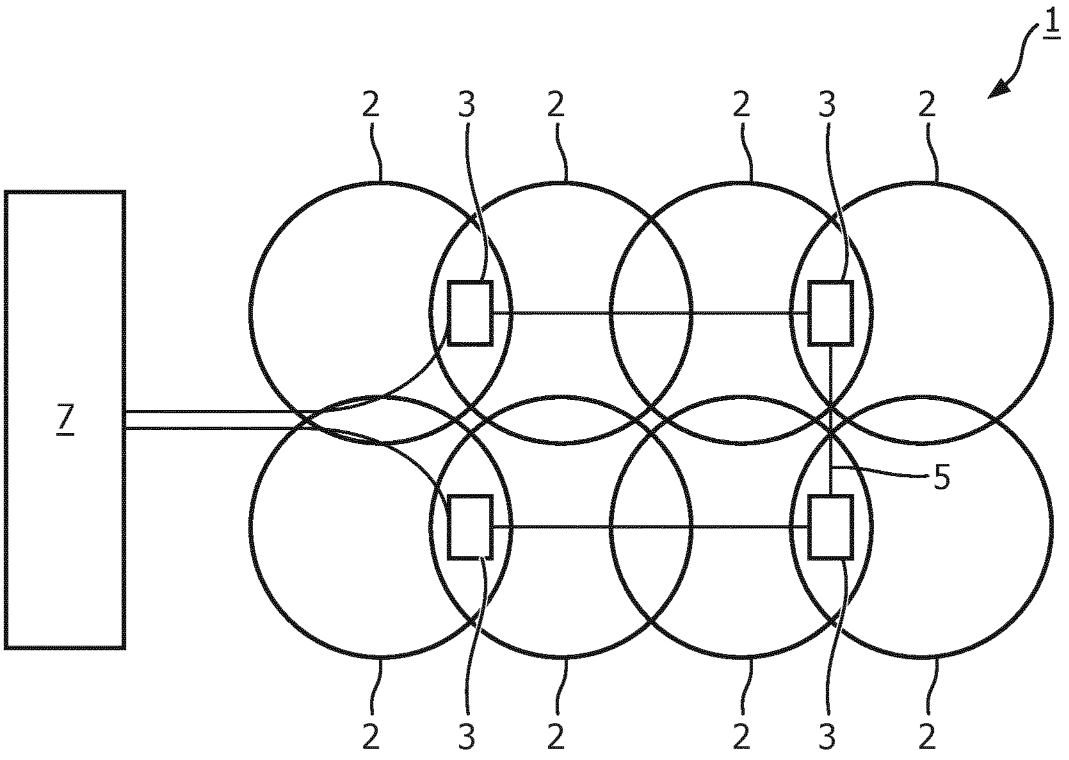
FIG. 1 schematically depicts a radio frequency (RF) receiver array according to an embodiment of the invention, FIG. 2 schematically depicts two on-board digital receiver circuits of a radio frequency (RF) receiver array connected to each other by a galvanic connection according to an embodiment of the invention, FIG. 3 schematically depicts two on-board digital receiver circuits comprising an application-specific integrated circuit, ASIC according to another embodiment of the invention, FIG. 4 schematically depicts an implementation of a capacitive communication receiver according to an embodiment of the invention, FIG. 5 schematically depicts the main waveforms in a high-speed capacitive communication transmitter and receiver according to an embodiment of the invention.

FIG. 1 schematically depicts a radio frequency (RF) receiver array 1 according to an embodiment of the invention. The RF receiver array 1 comprises a plurality of receiver coil elements 2 for receiving a magnetic resonance signal from at least a portion of a target region. The target region can be, for example, parts of the human body. It is further shown in FIG. 1 that the RF receiver array 1 comprises a plurality of on-board digital receiver circuits 3 for processing the received magnetic resonance signal. The on-board digital receiver circuits 3 further comprising an application-specific integrated circuit 4, ASIC for on-coil digitization of the magnetic resonance signal Digitization at the receive coil elements 2 allows digital data to be transmitted between the digital receive circuits 3 or to the data interface system 7 of a magnetic resonance system, for example, to enable digital communication at upshifted frequency. The on-board digital receiver circuits 3 are connected in series with each other by signal lines 5. In an embodiment of the invention the signal lines 5 are wires or twisted differential pair cables or monolithic conductive lines. The signal lines 5 are configured and arranged to carry data between the on-board digital receiver circuits 3. The ASICs further comprising at least one on-chip capacitor 6 for each signal line 5. The one on-chip capacitors 6 provide a capacitive communication between the on-board digital receiver circuits 3 wherein the on-chip capacitor 6 is disposed in series with the signal line 5.

Figure 2:
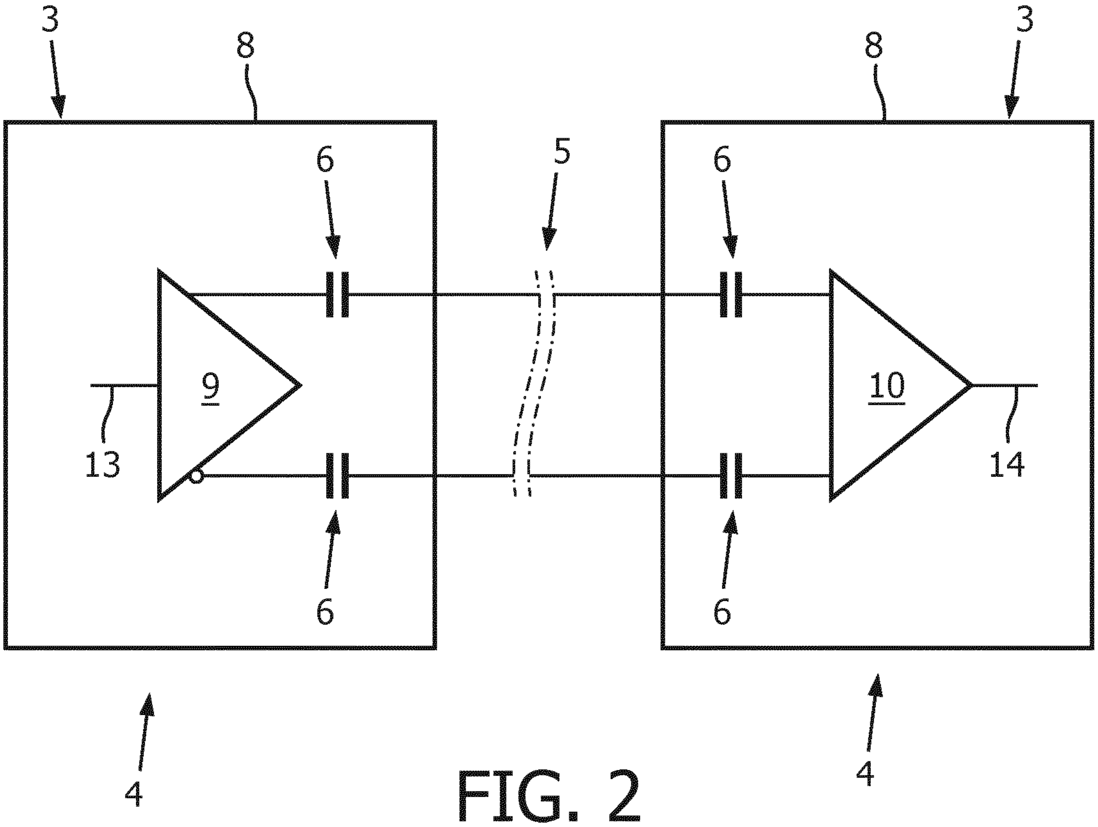

FIG. 2 schematically depicts two on-board digital receiver circuits 3 of a radio frequency (RF) receiver array 1 connected to each other by a galvanic connection according to an embodiment of the invention. Each of the on-board digital receiver circuits 3 comprises an application-specific integrated circuit 4, ASIC, wherein each of the ASICs 4 comprises a communication module 8. The communication modules 8 are connected by a galvanic connection over signal lines 5, wherein the signal lines 5 are wires, twisted differential pair cable or monolithic conductive lines. The left receiver ASIC 4 comprises a transmitter 9 for sending data over the signal lines 5. The right receiver ASIC 4 comprises a receiver 10 for receiving data over the signal lines 5. For each signal line 5 an on-chip capacitor 6 is disposed in series with each signal line 5 in the communication module. The on-chip capacitors 6 can be monolithically integrated capacitors 6, but also capacitors 6 fabricated in the PCB or even discrete capacitors 6. In an embodiment of the invention the on-chip capacitors 6 are on-chip high voltage and low capacitance capacitors. In an embodiment of the invention the capacitors 6 have a capacitance, for example, between 50 Femtofarad and 100 Femtofarad. The use of small value capacitors 6 makes sure to provide a high impedance path (>10 kOhm) at MR frequencies, blocking the current flow and eliminating the cable trapping requirement. Furthermore, it is also possible to implement an on-chip capacitor 6 that can withstand high voltage (>>1 kV) to provide safe galvanic isolation between the communication modules 8 of the on-board digital receiver circuits 3.

Figure 3:
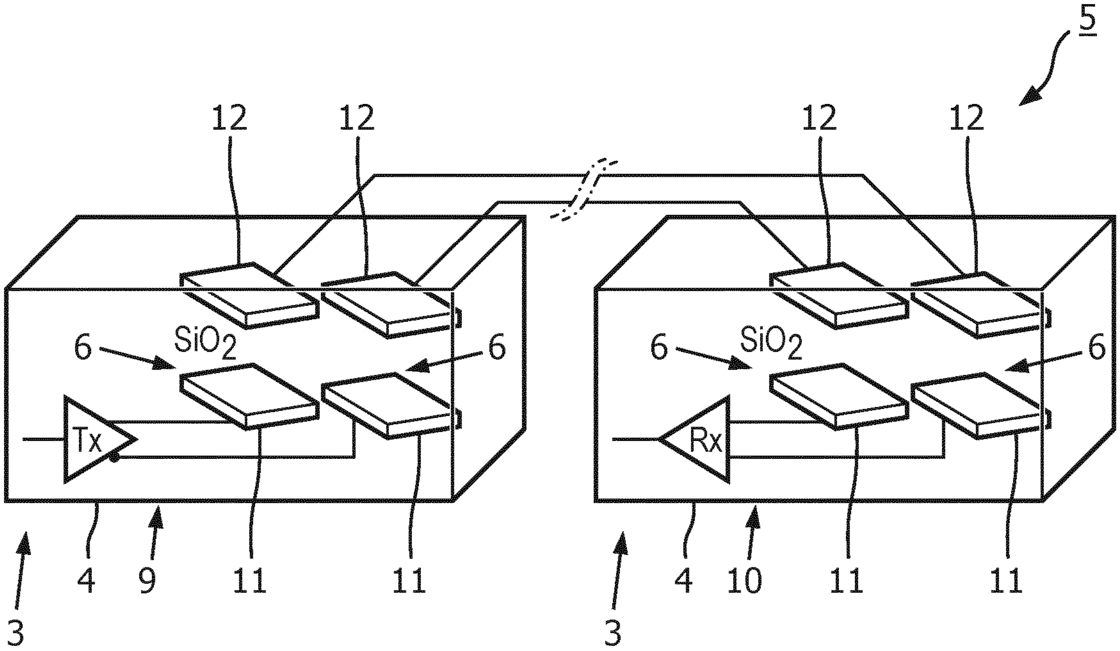

FIG. 3 schematically depicts two on-board digital receiver circuits 3 comprising an application-specific integrated circuit 4, ASIC according to another embodiment of the invention. In FIG. 3 in particular the implementation of the on-chip capacitors 6 according to an embodiment of the invention is shown. As shown in FIG. 3, the on-board capacitors 6 are formed between a lower metal layer 11 e.g. a first metal layer in the ASIC and a top metal layer 12 as an example Since high-quality SiO2 is used as isolation between the metal layers 11, 12 in the fabrication of the application-specific integrated circuit 4, it can withstand high voltage (~1 kV/um) stress. With the high impedance provided by the on-chip capacitors 6, the current induced by the transmit MR Field is reduced well below the level that can be achieved by the conventional method using RF cable traps.

Figure 4:
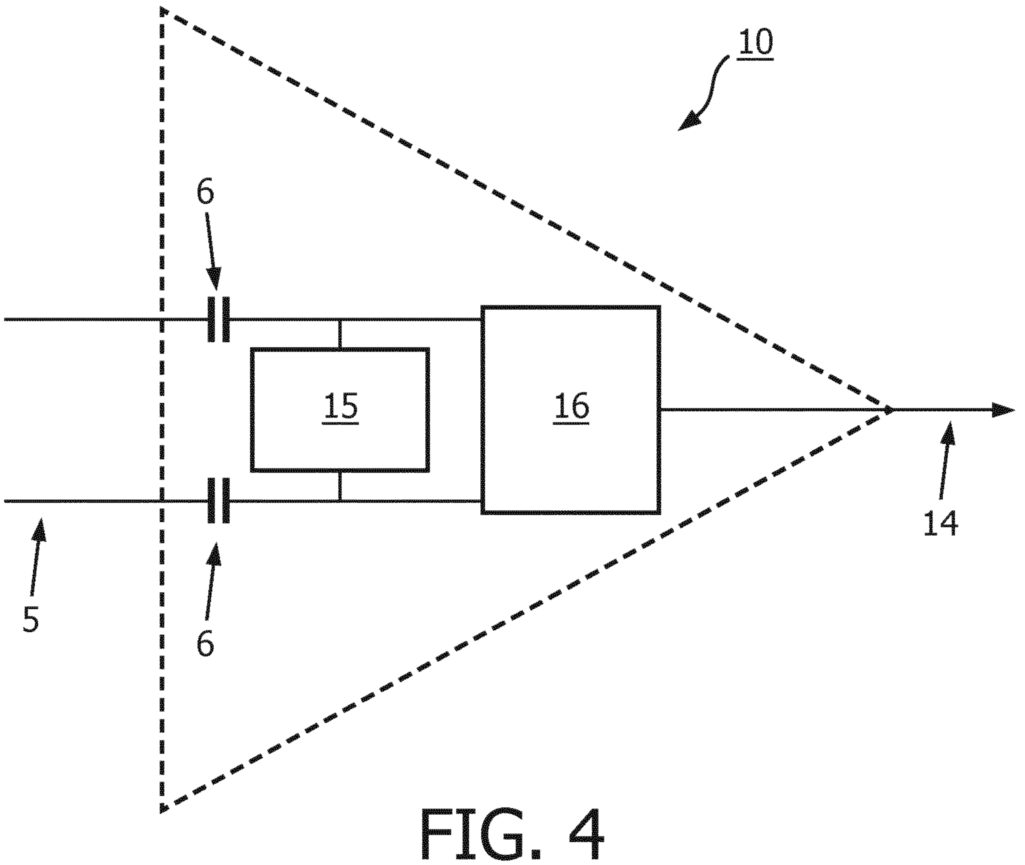

FIG. 4 schematically depicts an implementation of a capacitive communication receiver 10 according to an embodiment of the invention. In FIG. 4 two signal lines 5 coming from the left are connected in series with two on-board capacitors 6. Between the two signal lines 5 the positive input inp and the negative input imp a common-mode suppression circuit 15 is provided to reject the common-mode and to provide a dc bias point for the data construction circuit 16 where the data is reconstructed. The data output 14 is located on the right side of the receiver 10.

Figure 5:
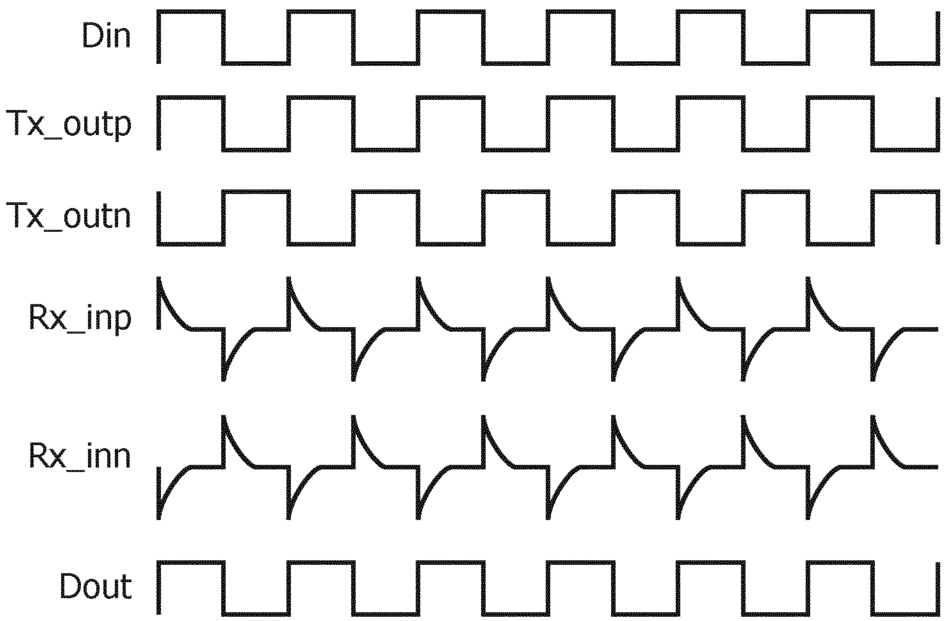

FIG. 5 schematically depicts the main waveforms in a high-speed capacitive communication transmitter 9 and receiver 10 according to an embodiment of the invention. The described method for communication in the MR receiver system is suitable for high-speed digital communication in the range of 1 Gbps or more. The communication signal lines 5 acts like a high pass filter blocking the MR signal and allowing the high-frequency content of the data to pass. The communication scheme illustrated in FIG. 5 is based on the data edge detection according to an embodiment of the invention. The first line in FIG. 5 shows the input data Din. The communication works as follows: the transmitter 9 sends an anti-phase block wave signal based on the incoming data Din shown in the second line of FIG. 5 for the positive output Tx_outp and for the negative output Tx_outn shown in the fourth line of FIG. 5. Because of the characteristic of the communication link the receiver 10 receives only the high-frequency part of the transmitted signal denoted by Rx_inp and Rx_inn shown in line four and five. The data construction circuit 16 reconstructs the data and sends it for further processing. In line five the output data Dout is shown.

Figure 6:
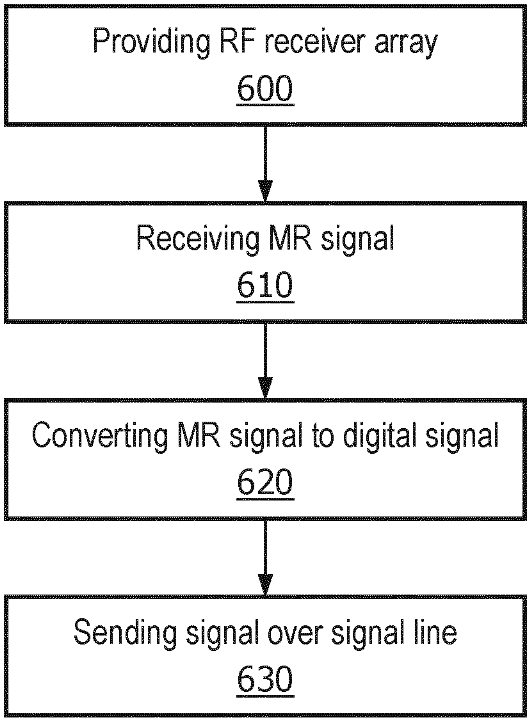
FIG. 6 shows a flowchart of a method for operating a radio frequency (RF) receiver array according to an embodiment of the invention.

FIG. 6 shows a flowchart of a method for operating a radio frequency (RF) receiver array 1 according to an embodiment of the invention. The method for operating a RF receiver array 1 starts in step 600 by providing a RF receiver array 1 as describes above. In step 610 a magnetic resonance signal is received from at least a portion of a target region using at least one receiver coil element 2 of the RF receiver array 1. In step 620 the magnetic resonance signal is converted to a digital signal by an application-specific integrated circuit 4, ASIC of an on-board digital receiver circuit 3 of the RF receiver array 1. In step 630 the digital data is send over at least one signal line 5 to a receiving unit 3, 7.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word “comprising” does not exclude other elements or steps, and the indefinite article “a” or “an” does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST

| | |
|---|---|
| radio frequency (RF) receiver array | 1 |
| receiver coil element | 2 |
| on-board digital receiver circuit | 3 |
| application-specific integrated circuit | 4 |
| signal line | 5 |
| on-chip capacitor | 6 |
| data interface | 7 |
| communication module | 8 |
| transmitter | 9 |
| receiver | 10 |
| metal layer | 11 |
| metal layer | 12 |
| data input | 13 |
| data output | 14 |
| common mode suppression circuit | 15 |
| data construction circuit | 16 |

-continued

| REFERENCE SYMBOL LIST | |
|---|---|
| positive input | inp |
| negative input | inn |
| data in | Din |
| data out | Dout |
| positive transmitter output | Tx_outp |
| negative transmitter output | Tx_outn |
| positive high frequency part of transmitted signal | Rx_inp |
| negative high frequency part of transmitted signal | Rx_inn |

The invention claimed is:

1. A radio frequency (RF) receiver array for magnetic resonance imaging, the RF receiver array comprising:
   - a plurality of receiver coil elements for receiving a magnetic resonance signals from at least a portion of a target region;
   - a plurality of on-board digital receiver circuits for processing the received magnetic resonance signals, each of the on-board digital receiver circuits comprising an application-specific integrated circuit, (ASIC) for on-coil digitization of the magnetic resonance signal; and
   - a plurality of signal lines configured and arranged to carry data between each of the on-board digital receiver circuits and a receiving unit,
   - wherein the ASIC comprises at least one on-chip capacitor for each signal line of the plurality of signal lines, for providing a capacitive communication between the on-board digital receiver circuit and the receiving unit, wherein the on-chip capacitor is disposed in series with the signal line, eliminating an RF cable trapping requirement.

2. The radio frequency (RF) receiver array according to claim 1,
   - wherein the receiving unit is a data interface of a magnetic resonance imaging system.

3. The radio frequency (RF) receiver array according to claim 1, wherein the ASIC of the on-board digital receiver circuit comprises a communication module for data communication over the signal lines, wherein the communication module comprises a transmitter and/or a receiver.

4. The radio frequency (RF) receiver array according to claim 3, wherein the receiver of the communication module comprises a common mode suppression circuit.

5. The radio frequency (RF) receiver array according to claim 1, wherein the plurality of signal lines are wires and/or a twisted differential pair cables and/or monolithic conductive lines.

6. The radio frequency (RF) receiver array according to claim 1, wherein the on-chip are capacitor is an on-chip high voltage, low capacitance capacitor.

7. The radio frequency (RF) receiver array according to claim 6, wherein the capacitance of the on-chip capacitor is about between 50 Femtofarad and 100 Femtofarad.

8. The radio frequency (RF) receiver array according to claim 1, wherein the on-chip capacitor is monolithically integrated into the ASIC of the on-board digital receiver circuit.

9. The radio frequency (RF) receiver array according to claim 8, wherein the on-chip capacitor is formed by:
   - a bottom electrode, wherein the bottom electrode is a portion of a first metal layer of the ASIC of the on-board digital receiver circuit,
   - an insulating layer formed on the bottom electrode, and
   - a top electrode formed on the insulating layer, wherein the top electrode is a portion of a second metal layer of the ASIC of the on-board digital receiver circuit.

10. The radio frequency (RF) receiver array according to claim 1, wherein the plurality of on-board digital receiver circuits are connected in series with each other by the plurality of signal lines.

11. A magnetic resonance imaging system comprising the radio frequency (RF) receiver array for magnetic resonance imaging according to claim 1.

12. The radio frequency (RF) receiver array according to claim 1, wherein the receiving unit is a second on-board digital receiver circuit.

13. The radio frequency (RF) receiver array according to claim 1, wherein the at least one on-chip capacitor provides an impedance of greater than 10 kΩ at a magnetic resonance transmit frequency, thereby blocking RF-induced common-mode currents and eliminating the RF cable trapping requirement.

14. A method for operating a radio frequency (RF) receiver array, the method comprising:
   - providing a plurality of receiver coil elements for receiving magnetic resonance signals from at least a portion of a target region;
   - providing a plurality of on-board digital receiver circuits for processing the received magnetic resonance signals, each of the on-board digital receiver circuits comprising an application-specific integrated circuit (ASIC) for on-coil digitization of the magnetic resonance signal;
   - providing a plurality of signal lines configured and arranged to carry data between each of the on-board digital receiver circuits and a receiving unit, wherein the ASIC comprises at least one on-chip capacitor for each signal line of the plurality of signal lines for providing a capacitive communication between the on-board digital receiver circuit and the receiving unit, wherein the on-chip capacitor is disposed in series with the signal line, eliminating an RF cable trapping requirement;
   - receiving the magnetic resonance signals from at least a portion of the target region using at the plurality of receiver coil elements of the RF receiver array;
   - converting the magnetic resonance signals to a digital signals by ASICs of the plurality of on-board digital receiver circuits of the RF receiver array; and
   - sending the digital data from each of the on-board digital receiver circuits over at least one signal line to the receiving unit.

15. The method according to claim 14, wherein sending the digital data over the at least one signal line to the receiving unit comprises:
   - providing a communication module in the ASIC of the on-board digital receiver circuit, the communication module comprising a transmitter and a receiver for data communication over the at least one signal line;
   - sending the digital data over the at least one signal lines-line to the receiving unit by the transmitter; and
   - receiving the digital data by the receiver of the communication module in the ASIC.

16. A non-transitory computer readable medium storing machine executable instructions, wherein when executed by a processor, the machine executable instructions cause the processor to control a radio frequency (RF) receiver array according to claim 12.

17. The method according to claim 14, wherein the receiving unit is a data interface of a magnetic resonance imaging system.

18. The method according to claim 15, wherein the receiver of the communication module comprises a common mode suppression circuit.

19. The method according to claim 14, wherein the on-chip capacitor is an on-chip high voltage, low capacitance capacitor.

20. The method according to claim 14, wherein the at least one on-chip capacitor provides an impedance of greater than 10 kΩ at a magnetic resonance transmit frequency, thereby blocking RF-induced common-mode currents and eliminating the RF cable trapping requirement.

* * * * *